(12) United States Patent
Strassburg et al.

(10) Patent No.: US 8,907,359 B2
(45) Date of Patent: Dec. 9, 2014

(54) OPTOELECTRONIC SEMICONDUCTOR COMPONENT

(75) Inventors: Martin Strassburg, Tegernheim (DE);
Lutz Höppel, Alteglofsheim (DE);
Matthias Peter, Regensburg (DE);
Ulrich Zehnder, Rettenbach (DE);
Tetsuya Taki, Regensburg (DE);
Andreas Leber, Regensburg (DE);
Rainer Butendeich, Regensburg (DE);
Thomas Bauer, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/124,707

(22) PCT Filed: Sep. 16, 2009

(86) PCT No.: PCT/DE2009/001322
§ 371 (c)(1),
(2), (4) Date: Jul. 18, 2011

(87) PCT Pub. No.: WO2010/045907
PCT Pub. Date: Apr. 29, 2010

(65) Prior Publication Data
US 2011/0316028 A1      Dec. 29, 2011

(30) Foreign Application Priority Data

Oct. 21, 2008   (DE) .......................... 10 2008 052 405

(51) Int. Cl.
*H01L 33/60*   (2010.01)
*H01L 33/40*   (2010.01)

(52) U.S. Cl.
CPC ...................................... *H01L 33/40* (2013.01)
USPC ................. 257/96; 257/98; 257/76; 257/103; 257/E21.09; 257/E29.004; 257/E33.032; 257/E21.127; 257/E21.121; 438/481; 438/478; 438/172

(58) Field of Classification Search
CPC ..................... H01L 21/0237; H01L 21/02639; H01L 21/02647; H01L 21/02642
USPC ........... 257/96, 17, 77, 79, 97, 15, 13, 14, 99, 257/197, 189; 438/46
See application file for complete search history.

(56) References Cited

U.S. PATENT DOCUMENTS

| 2004/0079951 A1 | 4/2004 | Horng et al. |
| 2006/0049417 A1 | 3/2006 | Li et al. |

(Continued)

FOREIGN PATENT DOCUMENTS

| TW | 569474 | 1/2004 |
| TW | 200703723 | 1/2007 |

(Continued)

OTHER PUBLICATIONS

Stephan Figge et al., "Magnesium segregation and the formation of pyramidal defects in ρ-GaN", Applied Physics Letters, vol. 81, No. 25, Dec. 16, 2002, pp. 4747-4750.

(Continued)

*Primary Examiner* — Jerome Jackson, Jr.
*Assistant Examiner* — Bo Fan
(74) *Attorney, Agent, or Firm* — Cozen O'Connor

(57) ABSTRACT

An optoelectronic semiconductor component comprising a semiconductor layer sequence (3) based on a nitride compound semiconductor and containing an n-doped region (4), a p-doped region (8) and an active zone (5) arranged between the n-doped region (4) and the p-doped region (8) is specified. The p-doped region (8) comprises a p-type contact layer (7) composed of $In_xAl_yGa_{1-x-y}N$ where $0 \leq x \leq 1$, $0 \leq y \leq 1$ and $x+y \leq 1$. The p-type contact layer (7) adjoins a connection layer (9) composed of a metal, a metal alloy or a transparent conductive oxide, wherein the p-type contact layer (7) has first domains (1) having a Ga-face orientation and second domains (2) having an N-face orientation at an interface with the connection layer (9).

13 Claims, 2 Drawing Sheets

(56) References Cited

U.S. PATENT DOCUMENTS

| | | | |
|---|---|---|---|
| 2006/0255341 A1* | 11/2006 | Pinnington et al. | 257/79 |
| 2007/0012937 A1 | 1/2007 | Liu et al. | |
| 2008/0111144 A1* | 5/2008 | Fichtenbaum et al. | 257/96 |
| 2008/0185608 A1 | 8/2008 | Chitnis | |

FOREIGN PATENT DOCUMENTS

| | | |
|---|---|---|
| TW | 200840095 | 10/2008 |
| WO | WO 2006/013698 | 2/2006 |
| WO | WO 2008/075581 | 6/2008 |

OTHER PUBLICATIONS

Th. Gessmann, et al., "High-efficiency AlGaInP light-emitting diodes for solid-state lighting applications", Journal of Applied Physics, vol. 95, No. 5, Mar. 1, 2004, pp. 2203-2216.

M. Hansen, et al., "Mg-rich precipitates in the p-type doping of InGaN-based laser diodes", Applied Physics Letters, vol. 80, No. 14, Apr. 8, 2002, pp. 2469-2471.

T. Gessmann et al., "Ohmic contacts to p-type GaN mediated by polarization fields in thin $In_xGa_{1-x}N$ capping layers", Applied Physics Letters, vol. 80, No. 6, Feb. 11, 2002, pp. 986-988.

M. Leroux, et al., "Structural Defects and Relation with Optoelectronic Properties in Highly Mg-Doped GaN", Phys. Stat. Sol., vol. 192, No. 2, Apr. 2002, pp. 394-396.

Fichtenbaum N. et al., "Electrical characterization of p-type N-polar and Ga-polar GaN grown by metalorganic chemical vapor deposition", Applied Physics Letters, American Institute of Physics, Melville, N.Y., vol. 91, No. 17, Oct. 23, 207, pp. 172105-172105.

Jones, K.M. et al., "Investigation of inversion domains in GaN by electric-force microscopy", Allied Physics Letters, American Institute of Physics, Melville, N.Y., vol. 78, No. 17, Apr. 23, 2001, pp. 2497-2499.

Tavernier, P.R. et al., "The growth of N-face GaN by MOCVD: effect of Mg, Si, and In", Journal of Crystal Growth, Elsevier, Amsterdam, NL, vol. 264, No. 1-3, Mar. 15, 2004, pp. 150-158.

Stutzmann, M. et al., "Playing with Polarity", Physica Status Solidi. B. Research Akademie Verlag, Berlin, Germany, vol. 228, No. 2, Nov. 1, 2001, pp. 505-512.

Fichtenbaum et al, "Impurity incorporation in hetereoepitaxial N-face and Ga-face GaN films grown by metalorganic chemical vapor deposition", Journal of Crystal Growth, Elsevier, Amsterdam, NL, vol. 310, No. 6, Dec. 31, 2007, pp. 1124-1131.

Gessmann Th. et al., "Ohmic contact technology in III Nitrides using polarization effects of cap layers", Journal of Applied Physics, American Institute of Physics, New York, NY, vol. 92, No. 7, Oct. 1, 2002, pp. 3740-3744.

* cited by examiner

OPTOELECTRONIC SEMICONDUCTOR COMPONENT

RELATED APPLICATIONS

This is a U.S. national stage of application No. PCT/DE2009/001322, filed on Sep. 16, 2009.

This patent application claims the priority of German Patent Application No. 10 2008 052 405.0, filed Oct. 21, 2008, the disclosure content of which is hereby incorporated by reference.

FIELD OF THE INVENTION

The invention relates to an optoelectronic semiconductor component, in particular a component based on a nitride compound semiconductor, such as, for example, an LED or a laser diode.

BACKGROUND OF THE INVENTION

An optoelectronic semiconductor component generally comprises an n-doped region, a p-doped region and a radiation-emitting or radiation-receiving active zone arranged therebetween. In order to produce an electrical connection, the p-doped region and the n-doped region are provided with a connection layer at least in a partial region. The connection layer can be, for example, a metal layer or a layer composed of a transparent conductive oxide (TCO). When a p-doped nitride compound semiconductor layer is connected to an electrical connection layer, undesirably high voltage drops often occur at the interface between the semiconductor material and the connection layer, by virtue of which the efficiency of the optoelectronic component is reduced.

SUMMARY OF THE INVENTION

One object of the invention is to provide an improved optoelectronic semiconductor component based on a nitride compound semiconductor, which component is distinguished by an improved connection of a p-type contact layer to a connection layer. In particular, a smallest possible voltage drop is intended to occur at the interface between the p-type contact layer and the connection layer during the operation of the component.

In accordance with one embodiment, an optoelectronic semiconductor component comprises a semiconductor layer sequence based on a nitride compound semiconductor and containing an n-doped region, a p-doped region and an active zone arranged between the n-doped region and the p-doped region. The n-doped region and the p-doped region need not necessarily be formed completely from doped layers, but rather can in particular also contain undoped layers.

In the present context, "based on a nitride compound semiconductor" means that the semiconductor layer sequence or at least one layer thereof comprises a III nitride compound semiconductor material, preferably $In_xAl_yGa_{1-x-y}N$ where $0 \leq x \leq 1$, $0 \leq y \leq 1$ and $x+y \leq 1$. In this case, this material need not necessarily have a mathematically exact composition according to the above formula. Rather, it can comprise one or a plurality of dopants and additional constituents which substantially do not change the characteristic physical properties of the $In_xAl_yGa_{1-x-y}N$ material. For the sake of simplicity, however, the above formula includes only the essential constituents of the crystal lattice (In, Al, Ga, N), even if these can be replaced in part by small amounts of further substances.

The active zone can be, in particular, a radiation-emitting or a radiation-receiving active layer. The active layer can be embodied, for example, as a pn junction, as a double heterostructure, as a single quantum well structure or multiple quantum well structure. In this case, the designation quantum well structure encompasses any structure in which charge carriers experience a quantization of their energy states as a result of confinement. In particular, the designation quantum well structure does not include any indication about the dimensionality of the quantization. It therefore encompasses, inter alia, quantum wells, quantum wires and quantum dots and any combination of the structures.

The p-doped region has a p-type contact layer composed of $In_xAl_yGa_{1-x-y}N$ where $0 \leq x \leq 1$, $0 \leq y \leq 1$ and $x+y \leq 1$. In particular, the p-type contact layer can be a GaN layer.

The p-type contact layer adjoins a connection layer, which, in one configuration, comprises a metal or a metal alloy. In particular, the metal or the metal alloy can comprise or consist of Al, Ag or Au.

In a further configuration, the connection layer comprises a transparent conductive oxide. Transparent conductive oxides ("TCO" for short) are transparent, conductive materials, generally metal oxides such as, for example, zinc oxide, tin oxide, cadmium oxide, titanium oxide, indium oxide or indium tin oxide (ITO). Alongside binary metal-oxygen compounds such as, for example, $ZnO$, $SnO_2$ or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs.

At an interface with the connection layer, the p-type contact layer has first domains having a Ga-face orientation and second domains having an N-face orientation. The first domains and the second domains differ in the orientation of the crystal structure.

During epitaxial growth, nitride compound semiconductors generally form a wurtzite crystal structure, the crystallographic c-axis of which runs parallel to the growth direction. Depending on the growth parameters, domains with the so-called Ga-face orientation, corresponding to the crystallographic [0001] direction or domains having the so-called N-face orientation, corresponding to the crystallographic [000-1] direction, can arise in this case.

Nitride compound semiconductors have pyroelectric properties, that is to say that they have an electrical polarization even without an external electric field. The orientation of said electric field is opposite for the Ga-face orientation and the N-face orientation. For this reason, domains having Ga-face orientation and N-face orientation have different electrical properties.

It is advantageous if both domains with the Ga-face orientation and domains having the N-face orientation are present at the interface between the p-type contact layer composed of the nitride compound semiconductor material and the adjoining connection layer composed of a metal, a metal alloy or a transparent conductive oxide.

The Ga-face domains are advantageous for the p-type doping of the nitride compound semiconductor material. This is based on the fact that during the growth of the semiconductor material, in particular by means of MOVPE, hydrogen is incorporated into the semiconductor material, by virtue of which the p-type dopant, in particular magnesium, is partly passivated. The p-type dopant is activated for example by a thermal treatment in which hydrogen outdiffuses from the semiconductor material. It has been found that hydrogen can escape better from the Ga-face domains than from the N-face domains. This is based on the fact that hydrogen cannot penetrate, or can penetrate only with difficulty, through the interface at which the crystal growth undergoes transition from the Ga-face standard growth direction to an N-face growth direction. Consequently, the activation of the p-type dopant is simpler if the surface of the p-type contact layer has Ga-face domains.

On the other hand, the N-face domains have the advantage that they enable the semiconductor material to be connected to a connection layer composed of a metal, a metal alloy or a transparent conductive oxide with a low or even no voltage drop at all. This is based on the fact that the N-face domains have the properties of an n-type semiconductor material in the vicinity of the interface with the Ga-face domains. This effect is presumably based on the fact that in the N-face domains crystal defects occur which overcompensate for the acceptors of the nominally p-doped semiconductor material. By virtue of the fact that the N-face domains have n-type properties at the domain boundaries, a local tunnel junction forms between the p-doped semiconductor material of the p-type contact layer and the adjoining connection layer. This effect enables the connection of the connection layer virtually without a voltage drop.

On the other hand, it would not be advantageous, however, if the entire p-type contact layer had an N-face orientation, because hydrogen can escape only with difficulty from the N-face domains and, consequently, an activation of the p-type dopant, in particular magnesium, would be possible only with difficulty. Preferably, the p-type contact layer has an area proportion of at least 10% of domains having Ga-face orientation at the interface with the connection layer. Furthermore, the area proportion of the domains having Ga-face orientation is advantageously at most 90%.

In one preferred configuration, the p-type contact layer has an area proportion of at least 40% and at most 70% of domains having Ga-face orientation at the interface with the connection layer. The remaining at least 30% and at most 60% of the interface between the connection layer and p-type contact layer advantageously has domains having N-face orientation. Such a ratio of Ga-face domains to N-face domains enables firstly a comparatively low or no voltage drop at all at the interface between the p-type contact layer and the connection layer and advantageously also a good activation of the p-type dopant, for example magnesium. The voltage drop at the interface between the p-type contact layer and the connection layer is advantageously less than 0.2 V, particularly preferably less than 0.1 V.

The first and/or second domains have, for example, a lateral extent of approximately 10 nm to approximately 5 μm.

The N-face domains advantageously have a lateral extent of less than 1 μm, preferably of less than 100 nm, and particularly preferably of less than 10 nm. Such a small lateral extent of the N-face domains is advantageous for the activation of the p-type dopant.

The size of the domains and the ratio of the Ga-face domains to the N-face domains can be set, in particular, by means of the dopant concentration and the layer thickness of the p-type contact layer. The p-type contact layer can have, for example, a dopant concentration of between $5*10^{19}$ cm$^{-3}$ and $2*10^{21}$ cm$^{-3}$ inclusive. The dopant is preferably magnesium.

It has been found that N-face domains form, in particular, at a comparatively high dopant concentration on the growth surface. Preferably, therefore, the p-type contact layer is produced with a dopant concentration of more than $1*10^{20}$ cm$^{-3}$, in particular with a dopant concentration of between $1.5*10^{20}$ cm$^{-3}$ and $3*10^{20}$ cm$^{-3}$.

The thickness of the p-type contact layer is advantageously between 5 nm and 200 nm inclusive, particularly preferably 30 nm or less.

In one configuration, the active layer is a radiation-emitting layer and the connection layer is arranged at a radiation exit side of the component. In this case, the connection layer is advantageously formed by a transparent conductive oxide, such that the radiation emitted by the active layer can be coupled out from the component through the connection layer. In particular, the connection layer can contain indium tin oxide (ITO).

By virtue of the fact that the p-type contact layer has both Ga-face domains and N-face domains at the interface with the connection layer, it has a greater roughness than a p-type contact layer without a domain structure. This roughness has an advantageous effect on the coupling-out of radiation from the optoelectronic component. In particular, the roughness of the p-type contact layer can continue into the connection layer arranged thereon, such that the surface of the connection layer advantageously also has a comparatively high roughness. The connection layer can adjoin a surrounding medium such as air, for example, in which case a comparatively high roughness of the surface of the connection layer has an advantageous effect on the coupling-out of radiation because the total reflection of radiation at the interface with the surrounding medium, in particular also a multiple total reflection within the semiconductor body, is reduced.

In a further configuration of the optoelectronic component, the active layer is a radiation-emitting layer and the radiation exit side of the component lies opposite the connection layer as seen from the active layer. In this case, the radiation emitted by the active layer emerges from the optoelectronic component at a side lying opposite the p-type contact layer and the connection layer. In this configuration, the connection layer can be, in particular, a mirror layer composed of a metal or a metal alloy. The metal or the metal alloy preferably contains silver, aluminum or gold, or consists thereof. The radiation emitted by the active layer oppositely to the radiation exit side is advantageously reflected by the mirror layer in the direction of the radiation exit side in order to couple out there from the optoelectronic component.

Alternatively, the connection layer can also comprise a transparent conductive oxide such as ITO, for example, wherein the connection layer is succeeded preferably by a mirror layer as seen from the active layer. In this case, the mirror layer can be a layer composed of a metal or a metal alloy. Particularly preferably, the mirror layer is a dielectric mirror in this configuration. The dielectric mirror advantageously comprises a multiplicity of alternating layers composed of two dielectric materials having different refractive indices, for example alternating layers composed of $SiO_2$ and SiN. With a dielectric mirror, for a predefined wavelength or a predefined wavelength range, it is advantageously possible to obtain a higher reactivity than with a metallic mirror. When a dielectric mirror is used, the electrical connection of the p-type contact layer is effected via the transparent conductive oxide of the connection layer, which provides for sufficient current spreading even without a succeeding metal layer.

BRIEF DESCRIPTION OF THE DRAWINGS

The invention is explained in greater detail below on the basis of three exemplary embodiments.

In the figures.

DETAILED DESCRIPTION OF THE DRAWINGS

Identical or identically acting constituent parts are provided with the same reference symbols in each case in the figures. The constituent parts illustrated and also the size relationships of the constituent parts among one another should not be regarded as true to scale.

Figure 1:
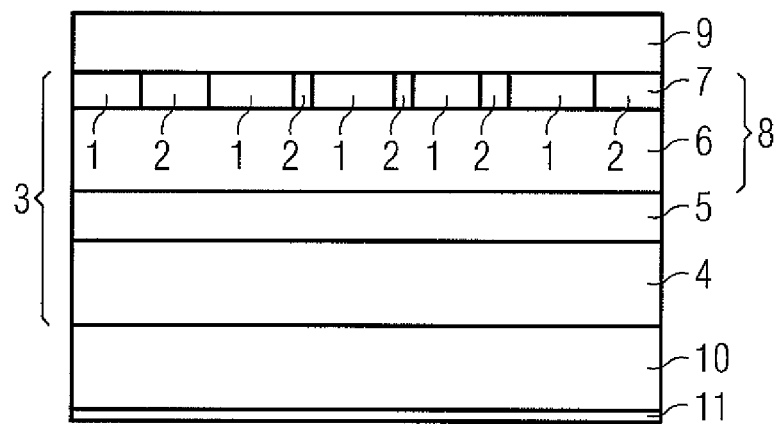
FIG. 1 shows a schematic illustration of a cross section through a first exemplary embodiment of an optoelectronic component.

The optoelectronic semiconductor component illustrated in FIG. 1 contains a semiconductor layer sequence 3 based on a nitride compound semiconductor material.

The semiconductor layers 4, 5, 6, 7 of the semiconductor layer sequence 3 therefore comprise, in particular, $In_xAl_yGa_{1-x-y}N$ where $0 \leq x \leq 1$, $0 \leq y \leq 1$ and $x+y \leq 1$.

The semiconductor layer sequence 3 is grown for example epitaxially onto a growth substrate 10. The growth substrate 10 is, for example, a sapphire substrate or a GaN substrate.

The semiconductor layer sequence 3 contains an n-doped region 4, a p-doped region 8 and an active layer 5 arranged between the n-doped region 4 and the p-doped region 8.

The n-doped region 4 and the p-doped region 8 can each comprise one or a plurality of semiconductor layers. Furthermore, the n-doped region 4 and the p-doped region can also contain undoped layers.

The active layer 5 can be, in particular, a radiation-emitting layer. In particular, the active layer 5 can comprise a pn junction or preferably a single or multiple quantum well structure. By way of example, the semiconductor component is an LED or a semiconductor laser. Alternatively, it is also possible for the active zone 5 to be a radiation-receiving layer and the optoelectronic semiconductor component to be a detector.

The p-doped region 8 contains a p-doped layer 6 and a p-type contact layer 7 composed of $In_xAl_yGa_{1-x-y}N$ where $0 \leq x \leq 1$, $0 \leq y \leq 1$ and $x+y \leq 1$. The p-type contact layer 7 adjoins a connection layer 9 composed of a metal, a metal alloy or a transparent conductive oxide.

The connection layer 9 serves for producing an electrical contact in order to conduct an electric current into the semiconductor layer sequence 3. A further electrical contact 11 can be arranged at the rear side of the substrate 10, for example, if an electrically conductive substrate is used.

The p-type contact layer 7 has different domains 1, 2 having a different orientation of the crystal structure of the nitride compound semiconductor material. In particular, the p-type contact layer 7 contains first domains 1 having a Ga-face orientation and second domains 2 having an N-face orientation at the interface with the connection layer 9. The Ga-face domains 1 are oriented in the [0001] crystal direction and the N-face domains 2 are oriented in the [000-1] crystal direction of the hexagonal crystal lattice of the nitride compound semiconductor material. On account of the different orientations of the bonds between the group III material (Ga, In or Al) and the N atoms in the Ga-face domains 1 and the N-face domains 2, the domains 1, 2 differ in terms of their mechanical and electrical properties.

It is advantageous if the p-type contact layer 7 has both Ga-face domains 1 and N-face domains 2.

The activation of the p-type dopant, preferably magnesium, of a nitride compound semiconductor material is generally effected by means of a thermal treatment in which hydrogen emerges from the semiconductor material. It has been found that hydrogen can escape better from the Ga-face domains 1 than from the N-face domains 2. Therefore, it is advantageous if at least partial regions of the p-type contact layer 7 have first domains 1 with the Ga-face orientation.

The N-face domains 2 advantageously enable the p-type contact layer 7 to be electrically connected to the connection layer 9 without a significant voltage drop. This is based on the fact that the domains 2 having N-face orientation, at the interface with the connection layer 9, have n-type properties despite the nominal p-type doping. It is assumed that in the N-face domains defects form in the crystal layer which lead to the overcompensation of the acceptors and are therefore responsible for the n-type property of the N-face domains 2.

At the interface with the connection layer 9, the N-face domains 2 form, on account of their n-type property, a tunnel junction by which the p-type contact layer 7 is electrically connected to the connection layer 9 without a significant voltage drop. Preferably, the voltage drop at the interface between the p-type contact layer 7 and the connection layer 9 is less than 0.2 V, particularly less than 0.1 V.

The voltage drop of more than 0.2 V that typically occurs when a conventional p-doped nitride compound semiconductor layer is electrically connected to a connection layer, for example a layer composed of a transparent conductive oxide, is reduced or even completely prevented by the N-face domains in the p-type contact layer 7.

The connection layer 9 is preferably a layer composed of a transparent conductive oxide, for example ITO or ZnO. A connection layer 9 composed of a transparent conductive oxide is advantageous, in particular, if the optoelectronic semiconductor component is an LED in which the radiation is coupled out through the connection layer 9. In this case, the connection layer 9 can advantageously be applied to the entire p-type contact layer 7, as a result of which good current spreading takes place without significant absorption losses in the connection layer 9.

Alternatively, the connection layer 9 can be a layer composed of a metal or a metal alloy, which in this case is applied to the p-type contact layer 7 preferably only in regions. In the case of a connection layer 9 composed of a metal or a metal alloy, the latter can, for example, comprise aluminum or consist thereof.

At the interface with the connection layer 9, the p-type contact layer 7 advantageously has an area proportion of at least 10% and at most 90%, particularly preferably at least 40% and at most 70%, of domains having Ga-face orientation.

The first and second domains 1, 2 need not necessarily, as illustrated in FIG. 1, extend through the entire thickness of the p-type contact layer 7, but rather can alternatively also be formed only in the region of the interface with the connection layer 9. Consequently, both the vertical and the lateral extent of the domains can differ from one another. In particular, the lateral extent of the first and second domains 1, 2 does not have to be constant over the layer thickness of the p-type contact layer 7, but rather can also vary. By way of example, the domains 1, 2 can have the form of truncated pyramids.

The embodiment of the Ga-face domains 1 and of the N-face domains 2 is dependent, in particular, on the dopant concentration and the layer thickness of the p-type contact layer 7.

In order that both Ga-face domains 1 and N-face domains 2 are formed in the p-type contact layer 7, the thickness of the p-type contact layer 7 is advantageously set between 5 nm and 200 nm and the dopant concentration between $5*10^{19}$ cm$^{-3}$ and $2*10^{21}$ cm$^{-3}$ inclusive. Preferably, the p-type contact layer 7 has a thickness of 20 nm or less. The dopant concentration is preferably more than $1*10^{20}$ cm$^{-3}$, for example between $1.5*10^{20}$ cm$^{-3}$ and $3*10^{20}$ cm$^{-3}$.

The lateral extent of the first domains 1 and/or second domains 2 is between 10 nm and 5 μm, for example, at the interface between the p-type contact layer 7 and the connection layer 9.

It is particularly advantageous if the lateral extent of the N-face domains 2, at the interface with the connection layer 9, is less than 1 μm, preferably less than 100 nm, and particularly preferably less than 10 nm. What is achieved in this way is that sufficiently many and large Ga-face domains 1 through which hydrogen can escape upon activation of the p-type dopant in the p-type contact layer 7 are arranged between the N-face domains 2.

By virtue of the fact that first domains 1 and second domains 2 are formed in the p-type contact layer 7, the p-type contact layer 7 has a greater roughness than conventional p-type contact layers composed of a nitride compound semiconductor. This increased roughness can propagate from the interface with the connection layer 9 as far as the surface of the connection layer 9, which has an advantageous effect on the coupling-out of radiation from the optoelectronic semiconductor component.

Figure 2:
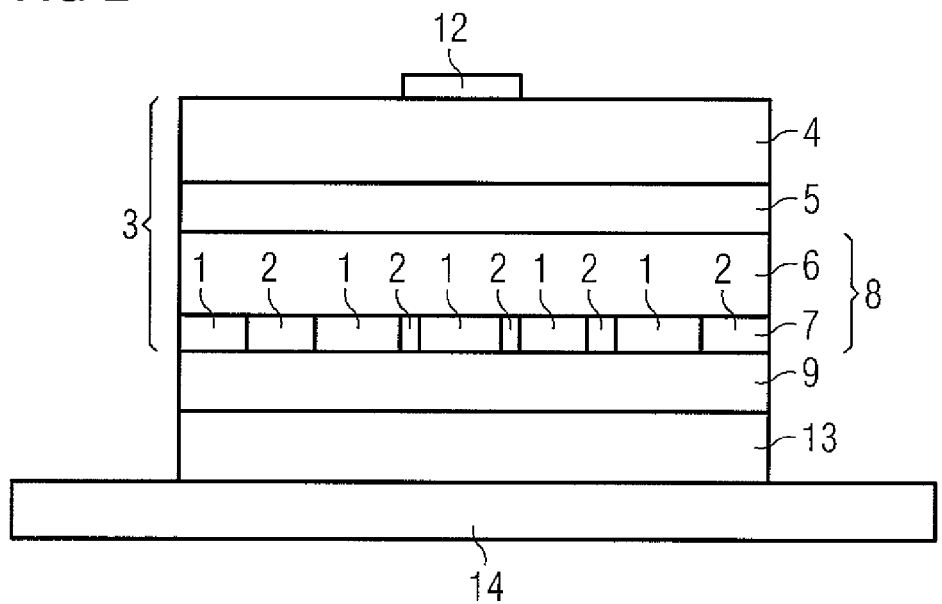
FIG. 2 shows a schematic illustration of a cross section through a second exemplary embodiment of an optoelectronic component.

The exemplary embodiment of an optoelectronic semiconductor component as illustrated in FIG. 2 is a so-called thin-film LED, in which the semiconductor layer sequence 3 has been detached from its original growth substrate. The original growth substrate has been detached from the n-doped region 4, which, in this exemplary embodiment, is arranged at the radiation exit side of the optoelectronic component. On the opposite side to the original growth substrate, the semiconductor component is applied to a carrier body 14 by means of a solder layer 13, for example. As seen from the active layer 5, therefore, the p-doped region 8 with the p-type contact layer 7 faces the carrier body 14. The carrier body 14 can comprise germanium or a ceramic, for example.

As in the exemplary embodiment described previously, the p-type contact layer 7 contains first domains 1 with Ga-face orientation and second domains 2 with N-face orientation. The p-type contact layer 7 having the first and the second domains 1, 2 adjoins the connection layer 9, which advantageously contains a metal or a metal alloy. In order to produce a second electrical connection, a contact layer 12 can be applied to the n-doped region 4.

The advantageous configurations of the domains 1, 2 in the p-type contact layer 7 and the associated advantages for the electrical connection to the connection layer 9 correspond to the exemplary embodiment described previously.

The connection layer 9 is preferably a reflective layer in order that the radiation emitted by the active zone 5 in the direction of the carrier body 14 is reflected to the opposite radiation exit area at the surface of the n-doped region 4. The reflective connection layer 9 can, in particular, comprise or consist of aluminum, silver or gold. One or a plurality of further layers can be arranged (not illustrated) between the reflective connection layer 9 and the solder layer 13 by which the semiconductor component is connected to the carrier body 14. In particular, said further layer(s) can be an adhesion layer, a wetting layer and/or a barrier layer which is intended to prevent diffusion of the material of the solder layer 13 into the reflective connection layer 9.

Figure 3:
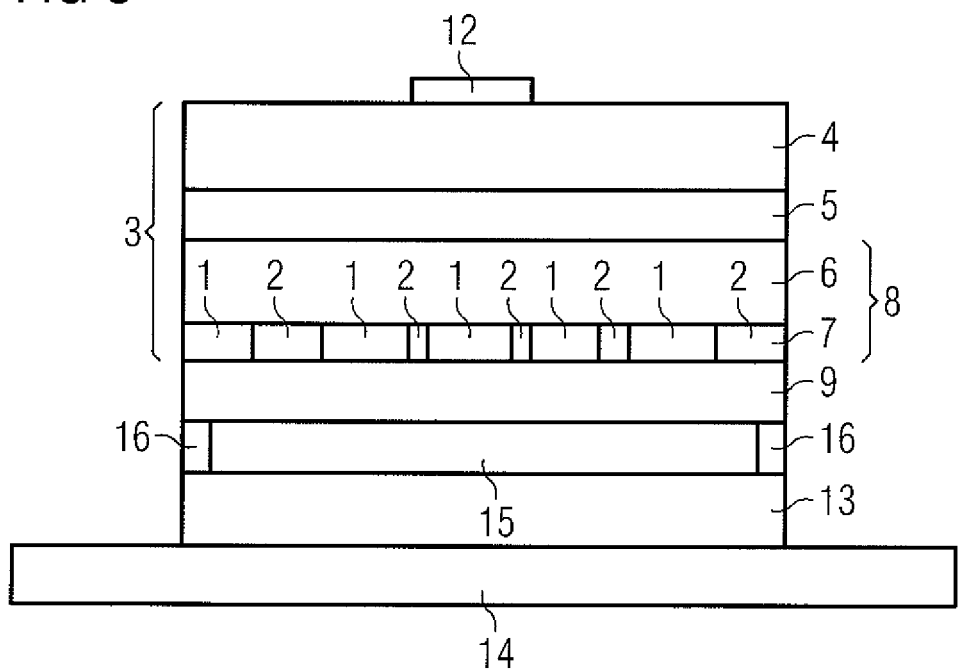
FIG. 3 shows a schematic illustration of a cross section through a third exemplary embodiment of an optoelectronic component.

The further exemplary embodiment of an optoelectronic semiconductor component as illustrated in FIG. 3 differs from the component illustrated in FIG. 2 in that the connection layer 9 is not a layer composed of a metal or a metal alloy, but rather a layer composed of a transparent conductive oxide.

In particular, the connection layer 9, which adjoins the p-type contact layer 7, can be a layer composed of indium tin oxide (ITO). As seen from the active layer 5, the transparent connection layer 9 is succeeded by a mirror layer 15.

The mirror layer 15 can be a dielectric mirror, in particular. The dielectric mirror 15 can contain, for example, a multiplicity of alternating SiO$_2$ layers and SiN layers. A dielectric mirror has the advantage over metallic mirrors that, for a predefined wavelength or a predefined wavelength range, generally it is possible to obtain a higher reflection than with the metallic mirror layer. In the case of a dielectric mirror 15, the connection layer 9 can be connected to the solder layer 13, for example by means of one or a plurality of electrically conductive connections 16.

For the rest, the exemplary embodiment in FIG. 3 corresponds to the exemplary embodiment illustrated in FIG. 2 with regard to its functioning and the further advantageous configurations.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic semiconductor component comprising a
    semiconductor layer sequence based on a nitride compound semiconductor and containing an n-doped region, a p-doped region and an active zone arranged between the n-doped region and the p-doped region, wherein the p-doped region comprises a p-doped contact layer composed of In$_x$Al$_y$Ga$_{1-x-y}$N where 0≤x≤1, 0≤y≤1 and x+y≤1, which adjoins a connection layer composed of a metal, a metal alloy or a transparent conductive oxide, and wherein the p-doped contact layer has first domains having a Ga-face orientation and second domains having an N-face orientation at an interface with the connection layer, wherein the p-doped contact layer is doped with magnesium, wherein the p-doped contact layer has a dopant concentration of between $5*10^{19}$ cm$^{-3}$ and $2*10^{21}$ cm$^{-3}$ inclusive, and wherein the p-doped contact layer has a thickness of between 5 nm and 200 nm, inclusive, and further wherein the p-doped contact layer has an area proportion of at least 10% and at most 90% of domains having Ga-face orientation at the interface with the connection layer.

2. The optoelectronic semiconductor component according to claim 1, wherein the p-doped contact layer has an area proportion of at least 40% and at most 70% of domains having Ga-face orientation at the interface with the connection layer.

3. The optoelectronic semiconductor component according to claim 1, wherein the first domains and/or the second domains each have a lateral extent of 10 nm to 5 gm.

4. The optoelectronic semiconductor component according to claim 1, wherein the second domains have a lateral extent of less than 1 um.

5. The optoelectronic semiconductor component according to claim 1, wherein the p-doped contact layer has a dopant concentration of between $1*10^{20}$ cm$^{-3}$ and $2*10^{21}$ cm$^{-3}$ inclusive.

6. The optoelectronic semiconductor component according to claim 1, wherein the p-doped contact layer has a thickness of between 5 nm and 30 nm inclusive or less.

7. The optoelectronic semiconductor component according to claim 1, wherein the active zone is a radiation-emitting layer and the connection layer is arranged at a radiation exit side of the component.

8. The optoelectronic semiconductor component according to claim 7, wherein the connection layer comprises a transparent conductive oxide.

9. The optoelectronic semiconductor component according to claim 1, wherein the active zone is a radiation-emitting layer mad a radiation exit side of the component lies opposite the connection layer as seen from the radiation-emitting layer.

10. The optoelectronic semiconductor component according to claim 9, wherein the connection layer is a mirror layer composed of a metal or a metal alloy.

11. The optoelectronic semiconductor component according to claim 9, wherein the connection layer comprises a transparent conductive oxide.

12. The optoelectronic semiconductor component according to claim 11, wherein the connection layer is succeeded by a mirror layer as seen from the active layer.

13. The optoelectronic semiconductor component according to claim 12, wherein the mirror layer is a dielectric mirror.

* * * * *

UNITED STATES PATENT AND TRADEMARK OFFICE
CERTIFICATE OF CORRECTION

| | | |
|---|---|---|
| PATENT NO. | : 8,907,359 B2 | Page 1 of 1 |
| APPLICATION NO. | : 13/124707 | |
| DATED | : December 9, 2014 | |
| INVENTOR(S) | : Martin Strassburg et al. | |

It is certified that error appears in the above-identified patent and that said Letters Patent is hereby corrected as shown below:

In the Claims,

Column 8, claim 3, line 55 should read:

3. The optoelectronic semiconductor component according to claim 1, wherein the first domains and/or the second domains each have a lateral extent of 10 nm to 5 µm.

Signed and Sealed this
Thirtieth Day of June, 2015

Michelle K. Lee
*Director of the United States Patent and Trademark Office*